US009360880B2

(12) United States Patent
Kwon

(10) Patent No.: US 9,360,880 B2
(45) Date of Patent: Jun. 7, 2016

(54) INTEGRATED CIRCUIT

(71) Applicant: SK hynix Inc., Gyeonggi-do (KR)

(72) Inventor: Jae-Kwan Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 303 days.

(21) Appl. No.: 14/107,723

(22) Filed: Dec. 16, 2013

(65) Prior Publication Data

US 2014/0354260 A1 Dec. 4, 2014

(30) Foreign Application Priority Data

May 31, 2013 (KR) ........................ 10-2013-0062499

(51) Int. Cl.
*G11C 7/00* (2006.01)
*G05F 3/08* (2006.01)
*G05F 3/24* (2006.01)

(52) U.S. Cl.
CPC ... *G05F 3/08* (2013.01); *G05F 3/24* (2013.01)

(58) Field of Classification Search
CPC ....... G11C 5/147; G11C 5/14; G11C 11/1074
USPC .................................. 365/226, 206, 207, 208
See application file for complete search history.

(56) References Cited

U.S. PATENT DOCUMENTS

| | | | | |
|---|---|---|---|---|
| 5,544,120 | A | 8/1996 | Kuwagata et al. | |
| 7,283,413 | B2 * | 10/2007 | Choi | G11C 7/062 365/189.08 |
| 8,320,211 | B1 * | 11/2012 | Chang | G11C 16/06 327/55 |
| 2005/0104819 | A1 | 5/2005 | Shimoda | |

* cited by examiner

*Primary Examiner* — Son Dinh
(74) *Attorney, Agent, or Firm* — IP & T Group LLP

(57) ABSTRACT

An integrated circuit includes a node setting block connected to a reference node and suitable for setting a voltage level of the reference node to a reference voltage level, a plurality of control voltage generation units connected in series to a reference node and suitable for generating a plurality of control voltages of which voltage level is variable and a current sensing circuit suitable for sensing a variation of a current flowing through a signal transmission line by using the plurality of control voltages, the signal transmission line connected to an internal circuit and a voltage level of the signal transmission line being fixed.

17 Claims, 5 Drawing Sheets

INTEGRATED CIRCUIT

CROSS-REFERENCE TO RELATED APPLICATIONS

The present application claims priority of Korean Patent Application No. 10-2013-0062499, filed on May 31, 2013, which is incorporated herein by reference in its entirety.

BACKGROUND

1. Field

Exemplary embodiments of the present invention relate to a semiconductor design technology, and, more particularly, to a control voltage generation circuit for controlling an operation of a circuit that senses a variation in current amount of a signal transmission line connected to an internal circuit and detects an operation state of the internal circuit.

2. Description of the Related Art

Recently, demand for a non-volatile semiconductor memory device has increased. Further, to develop a memory device of a large capacity, research has been actively conducted for a high integration of a memory device.

FIG. 1 is a block diagram illustrating a conventional non-volatile memory device.

Referring to FIG. 1, the non-volatile memory device induces a memory cell array 10, which has a plurality of memory cells, and a page buffer 20.

The page buffer 20 includes a bit line selection unit 21, a precharge unit 22, and a register 23. The bit line selection unit 21 is connected between bit lines BLe and BLo and a sensing node SO. The precharge unit 22 is connected to the sensing node SO. The register 23 is connected between the sensing node SO and an input/output terminal YA. The register 23 includes a latch 24, which latches data.

The page buffer 20 transmits data to be stored to the bit line BLe or BLo and latches read data transmitted through the bit line BLe or BLo from the memory cell array 10 in the latch 24 of the register 23 via the sensing node SO precharged by the precharge unit 22. The sensing node SO is precharged by the precharge unit 22 during various operations of the non-volatile memory device.

In a read operation for identifying a state of a cell, cell current of a cell to be read is sensed through the bit line BLe or BLo, and the state of the cell is identified according to a sensing result. For example, in the case where the cell to be read has stored data and the cell current does not flow, the voltage level of the bit line BLe or BLo will retain the level as it is, and, in the case where the cell to be read does not have stored data and the cell current flows, the voltage level of the bit line BLe or BLo will fall lower than a preset level. These states are detected through the sensing node SO, and the state of the cell is identified.

However, as the degree of integration of a non-volatile memory device increases and low power is used, the cell current of a cell gradually decreases. Accordingly in a read operation, a variation range in the voltage level of the bit line BLe or BLo for identifying the state of a cell narrows, and a reading margin gradually decreases by that extent. Therefore, since it takes a long time to identify the state of a cell with the narrowed variation range in the voltage level of the bit line, operation speed of the device is likely to decrease.

SUMMARY

Various embodiments are described that are directed to a control voltage generation circuit, which may significantly reduce power consumption while occupying a minimum area when generating a plurality of control voltages to control operations of a circuit that detects a variation in a current amount of a signal transmission line connected to an internal circuit and senses an operation state of the internal circuit.

In an exemplary embodiment, an integrated circuit may include a node setting block connected to a reference node and suitable for setting a voltage level of the reference node to a reference voltage level, a plurality of control voltage generation units connected in series to a reference node and suitable for generating a plurality of control voltages of which voltage level is variable, and a current sensing circuit suitable for sensing a variation of a current flowing through a signal transmission line by using the plurality of control voltages—the signal transmission line being connected to an internal circuit and a voltage level of the signal transmission line being fixed.

In another exemplary embodiment, an integrated circuit may include a reference level setting unit connected to a reference node and suitable for setting the voltage level of the reference node to a reference voltage level, a first level setting unit including a first transistor of a diode type connected to the reference node and suitable for generating a first voltage with a voltage level higher than the reference voltage level, a second level setting unit including a first resistor connected in series to the first level setting unit in series and suitable for generating a second voltage with a voltage level higher than that of the first voltage, a third level setting unit including a second resistor connected in series to the second level setting unit and suitable for generating a third voltage with a voltage level higher than that of the second voltage, a current sourcing unit connected in series to the third level setting unit and suitable for supplying a reference current with a predetermined magnitude to the first through the third level setting units, and a current sensing circuit suitable for sensing a variation of a current flowing through a signal transmission line by using the first through the third voltages—the signal transmission line being connected to an internal circuit and a voltage level of the signal transmission line being fixed.

As a result of the above embodiments, a smaller number of elements, each occupying a relatively large area and consuming a large power, may be used and thus may simplify a control voltage generation circuit for controlling an operation of a circuit that senses a variation in current amount of a signal transmission line connected to an internal circuit and detects an operation state of the internal circuit.

DETAILED DESCRIPTION

Figure 1:
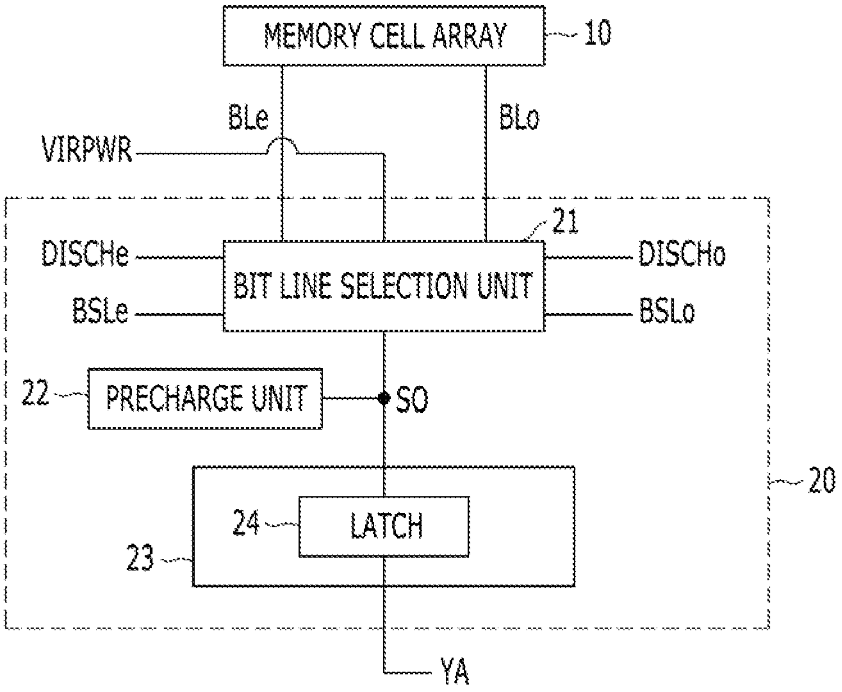
FIG. 1 (PRIOR ART)
FIG. 1 is a block diagram illustrating a conventional non-volatile memory device.

Various embodiments will be described below in snore detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
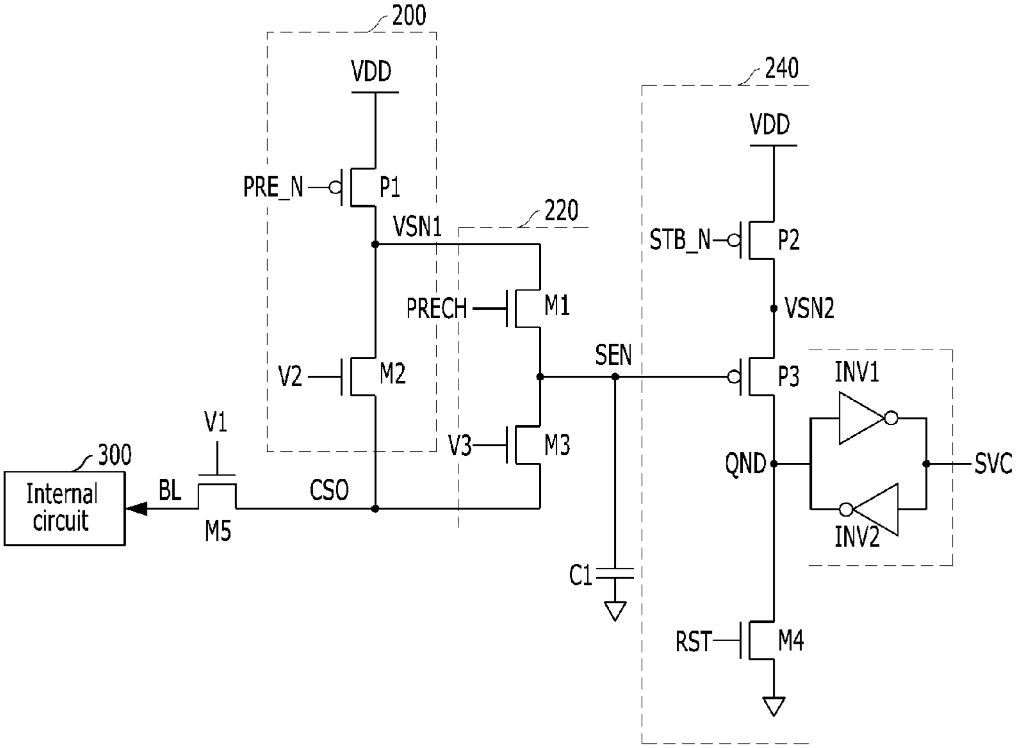
FIG. 2 is a circuit diagram illustrating a current sensing circuit having a page buffer of a non-volatile memory device.

FIG. 2 is a circuit diagram illustrating a current sensing circuit having a page buffer of a non-volatile memory device.

Referring to FIG. 2, the current sensing circuit may include the page buffer of a non-volatile memory device, which reads cell data according to a current sensing scheme, may include a level fixing transistor M5, a first current supply unit 200, a second current supply unit 220, and a sensing signal generation unit 240.

As an exemplarily setting of the voltages of the respective nodes for a read operation, a first voltage V1 has the voltage level of VBL+VTH that is a sum of a reference voltage level VBL and a threshold voltage level VTH; a second voltage V2 has the voltage level of VBL+VK+VTH that is a sum of the reference voltage level VBL, the threshold voltage level VTH and a first additional voltage level VK; and a third voltage V3 has the voltage level of VBL+VK+VL+VTH that is a sum of the reference voltage level VBL, the threshold voltage level VTH, the first additional voltage level VK and a second additional voltage level VL The level fixing transistor M5 is connected between a bit line BL and a sourcing node CSO and fixes a voltage level of the bit line BL to the reference voltage level VBL through a voltage level of the sourcing node CSO regardless of current between the sourcing node CSO and the bit line BL in response to the first voltage V1.

Because the first voltage V1, which has the voltage level of VBL+VTH, retains a voltage level that is higher by the threshold voltage level VTH of a transistor than the reference voltage level VBL, the level fixing transistor M5 remains turned on during a period in which the first voltage V1 is supplied.

Because the voltage level of the first voltage V1 is higher by the reference voltage level VBL than the threshold voltage level VTH of the transistor M5, the bit line BL retains the reference voltage level VBL even when the voltage level of the sourcing node CSO is as high as the level of a power supply voltage VDD.

Regardless of current between the sourcing node CSO and the bit line BL by a cell state connected to the bit line BL, the bit line BL retains the reference voltage level VBL because the state of the level fixing transistor M5 remains unchanged.

When the voltage level of the sourcing node CSO is lower than the reference voltage level VBL, the voltage level of the bit line BL may become lower than the reference voltage level VBL. An operation for retaining the voltage level of the sourcing node CSO to be higher than the reference voltage level VBL is required to keep the voltage level of the bit line to the reference voltage level VBL, and the operation may be performed by the first current supply unit 200.

The first current supply unit 200 may include a PMOS transistor P1, which controls the connection between the power supply voltage VDD and a first power supply node VSN1 in response to a first power supply signal PRE_N, and an NMOS transistor M2, which controls an amount of current flowing from the first power supply node VSN1 to the sourcing node CSO in response to the second voltage V2.

The first current supply unit 200 may retain the voltage level of the sourcing node CSO to a level of VBL+VK higher than the reference voltage level VBL in response to a second voltage V2 during a period in which current flows from a power supply voltage VDD to the sourcing node CSO. Because the second voltage V2 has the voltage level of VBL+VK+VTH or a voltage level that is a sum of the first additional voltage level VK, the threshold voltage level VTH and the reference voltage level VBL, the NMOS transistor M2 remains turned on during a period in which the second voltage V2 is supplied. The first power supply signal PRE_N retains the level of a ground voltage VSS during a period of sensing the state of the cell, and the PMOS transistor P1 remains turned on. Therefore, during the period in which the second voltage V2 is stably supplied, the voltage level of the sourcing node CSO is higher by the first additional voltage level VK at the minimum than the reference voltage level VBL.

The second current supply unit 220 may include an NMOS transistor M1, which controls connection between the first power supply node VSN1 and a sensing node SEN in response to a precharge signal PRECH, and an NMOS transistor M3, which controls the amount of current flowing through the sensing node SEN to the sourcing node CSO in response to the third voltage V3.

The second current supply unit 220 may supply current through the sensing node SEN to the sourcing node CSO according to the state of the cell in response to a third voltage V3. Since the precharge signal PRECH retains the level of the ground voltage VSS during the period of sensing the state of the cell, the NMOS transistor M1 remains turned off. Because the third voltage V3 has the voltage level of VBL+VK+VL+VTH that is a sum of the first additional voltage level VK, a second additional voltage level VL, the threshold voltage level VTH, and the reference voltage level VBL, the NMOS transistor M3 remains turned on during a period in which the third voltage V3 is supplied. It is noted that the third voltage V3 has the voltage level higher than the second voltage V2 by the second additional voltage level VL. That ensures that the second current supply unit 220 performs its operation prior to the operation of the first current supply unit 200 as the current amount of the sensing node SEN varies according to the state of the cell. Detailed descriptions thereof will be given later when explaining the entire operation.

The sensing signal generation unit 240 may include a PMOS transistor P2, a PMOS transistor P3, an NMOS transistor M4, and a latch. The PMOS transistor P2 controls the connection between the power supply voltage VDD and a second power supply node VSN2 in response to a second power supply signal STB_N. The PMOS transistor P3 controls the amount of current flowing between the second power supply node VSN2 and a signal output node QND in response to the voltage level of the sensing node SEN. The NMOS transistor M4 controls the connection between the signal output node QND and the ground voltage VSS in response to a reset signal RST. The latch, which includes the connected first and second inverters INV1 and INV2 in a latch type, determines the voltage level of the signal output node QND on the basis of a logic determination level and latches the sensing signal SVC.

The sensing signal generation unit 240 may sense a variation in the current amount of the sensing node SEN and may determine the voltage level of the sensing signal SVC. The second power supply signal STB_N retains the level of the power supply voltage VDD during the period of sensing the state of the cell and allows the PMOS transistor P2 to remain turned off. Except for the period of sensing the state of the cell, the second power supply signal STB_N has the level of the ground voltage VSS and keeps the PMOS transistor P2 turned on to ensure that a variation in the voltage level of the sensing node SEN is reflected to the logic level of the sensing signal SVC at the end of the period of sensing the state of the cell The reset signal RST retains the level of the ground voltage VSS during the period of sensing the state of the cell, and the NMOS transistor M4 remains turned off. Therefore, if the voltage level of the sensing node SEN changes as the current amount of the sensing node SEN varies according to the state of the cell, the voltage level of the signal output node QND changes as the amount of current flowing through the second power supply node VSN2 and the PMOS transistor P3 to the signal output node QND varies.

The voltage level of the signal output node QND is close to the level of the ground voltage VSS before the period of sensing the state of the cell and changes to the level of the power supply voltage VDD during the period of sensing the state of the cell. Hence, the latch retains the logic level of the sensing signal SVC to a logic high level before the period of sensing the state of the cell and changes to a logic low level in correspondence to the voltage level of the signal output node QND becoming a voltage level higher than the logic determination level during the period of sensing the state of the cell.

A capacitor C1 is connected between the sensing node SEN and the ground voltage VSS to ensure that a predetermined amount of charge is accumulated at the sensing node SEN in a precharge operation to prevent sudden change of the voltage level of the sensing node SEN during the period of sensing the state of the cell.

Figure 3:
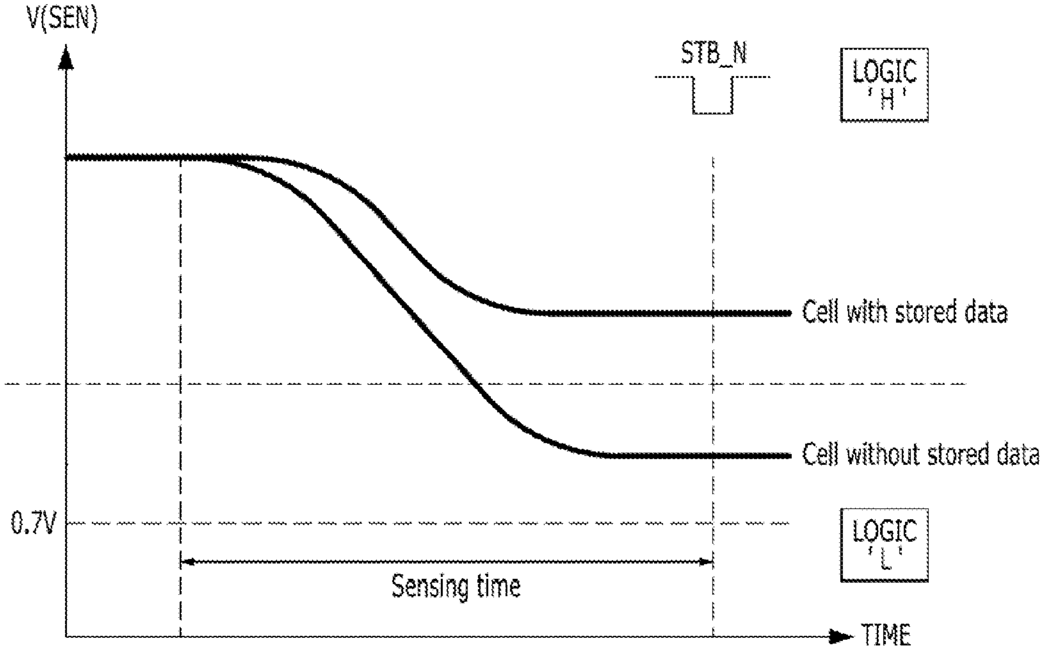
FIG. 3 is a graph illustrating operations of the page buffer of FIG. 2.

FIG. 3 is a graph illustrating operations of the page buffer of FIG. 2.

Read operations of the page buffer according to the current sensing scheme will be described with reference to FIGS. 2 and 3.

As an exemplarily setting of the voltages of the respective nodes for the read operations, the precharge signal PRECH has the level of the ground voltage VSS; the reference voltage level VBL is 0.5V; the first voltage V1 has the voltage level of 0.5+VTH that is a sum of the reference voltage level VBL of 0.5V and the threshold voltage level VTH; the second voltage V2 has the voltage level of 0.7+VTH that is a sum of the reference voltage level VBL of 0.5V, the threshold voltage level VTHm and the first additional voltage level VK of 0.2V; and the third voltage V3 has the voltage level of 0.9+VTH that is a sum of the reference voltage level VBL of 0.5V, the threshold voltage level VTH, the first additional voltage level VK of 0.2V, and the second additional voltage level VL of 0.2V. Further, at the beginning of the period of sensing the state of the cell the sensing node SEN, the sourcing node CSO, the first power supply node VSN1, and the second power supply node VSN2 have the level of the power supply voltage VDD, and the signal output node QND has the level of the ground voltage VSS.

In this state, if current flows through the cell, that is, the cell does not have stored data, current flows through the cell from the bit line BL. Since the voltage level of the sourcing node CSO is sufficiently as high as the level of the power supply voltage VDD, current flows through the level fixing transistor M5 and the voltage level of the sourcing node CSO is lowered.

When the voltage level of the sourcing node CSO becomes a voltage level lower than the voltage level of 0.9+VTH or the third voltage V3 that is a sum of the reference voltage level VBL of 0.5V, the threshold voltage level VTH, the first additional voltage level VK of 0.2V, and a second additional voltage level VL of 0.2V, the NMOS transistor M3 of the second current supply unit 220 is turned on, and current flows through the sensing node SEN and the NMOS transistor M3 to the bit line BL.

The NMOS transistor M2 of the first current supply unit 200 continuously retains turned off until the voltage level of the sourcing node CSO becomes a voltage level lower than the voltage level of 0.7+VTH or the second voltage V2 that is a sum of the reference voltage level VBL of 0.5V, the threshold voltage level VTH, and the first additional voltage level VK of 0.2V.

In this way, while the NMOS transistor M3 is turned on and current flows through the sensing node SEN and the NMOS transistor M3 to the bit line BL, the voltage level of the sensing node SEN falls. Accordingly, the sensing signal generation unit 240 transitions the level of the sensing signal SVC from the logic high level to the logic low level, which means that the cell does not have stored data.

When the voltage level of the sourcing node CSO becomes a voltage level lower than the voltage level of 0.7+VTH or the second voltage V2, the NMOS transistor M2 of the first current supply unit 200 is turned on and current flows through the first power supply node VSN1 and the NMOS transistor M2 to the bit line BL. At this time, the first power supply node VSN1 is connected with the power supply voltage VDD during the period of sensing the state of the cell, and the voltage level of the sourcing node CSO does not fall any more. As disclosed above, since the sourcing node CSO always retains a voltage level higher than the reference voltage level VBL during the period of sensing the state of the cell that does not have stored data and current flows through the cell from the bit line BL, the level fixing transistor M5 may allow the voltage level of the bit line BL to retain the reference voltage level VBL.

In a state in which current does not flow through the cell, that is, when the cell has stored data, as current does not flow through the cell from the bit line BL, the voltage level of the sourcing node CSO retains the level of the power supply voltage VDD. Accordingly, both the NMOS transistor M2 of the first current supply unit 200 and the NMOS transistor M3 of the second current supply unit 220 remain turned off. Therefore, current does not flow through the sensing node SEN; the voltage level of the sensing node SEN does not fall; the PMOS transistor P3 of the sensing signal generation unit 240 is not turned on; and the sensing signal SVC retains the logic high level, which means that the cell has stored data.

In the page buffer of FIG. 2, the voltage levels of the first power supply signal PRE_N, the second power supply signal STB_N, the precharge signal PRECH, and the reset signal RST are signals, which are the level of the power supply voltage VDD or the level of the ground voltage VSS during the period of sensing the state of the cell.

The first voltage V1, the second voltage V2, and the third voltage V3 may have differences in their voltage levels when compared to the reference voltage level VBL.

In detail, the voltage level of the first voltage V1 may be higher by the threshold voltage level VTH of the transistor than the voltage level to be applied to the bit line BL or the reference voltage level VBL. Namely, not to impede flow of current during the period in which the first voltage V1 is supplied, the voltage level of the first voltage V1, which should always turn on the level fixing transistor M5 and, at the same time fix, the bit line BL to the reference voltage level VBL, is a sum of the reference voltage level VBL and the threshold voltage level VTH of the level fixing transistor M5. With such voltage level of the first voltage V1, it is possible to fix the bit line BL to the reference voltage level VBL even when current flows from the sourcing node CSO to the bit line BL in the state where the voltage level of the sourcing node CSO is higher than the reference voltage level VBL.

The second voltage V2 may have a voltage level higher by the first additional voltage level VK than that of the first voltage V1. That is to say, to keep the voltage level of the sourcing node CSO higher than the reference voltage level VBL at the minimum even though current flows through the sourcing node CSO to the bit line BL, the second voltage V2 should have the voltage level VBL+VTH+VK that is a sum of the first additional voltage level VK and the voltage level of the first voltage V1 or the voltage level of VBL+VTH. For reference, because of the threshold voltage VTH of the NMOS transistor M2, which is controlled by the second voltage V2 with voltage level of VBL+VTH+VK, a maximum voltage level, which the sourcing node CSO may have, is the voltage level of VBL+VK. Accordingly, it is sufficient that the actual value of the first additional voltage level VK prevents the voltage level of the sourcing node CSO from decreasing by the amount of current flowing through the sourcing node CSO and the level fixing transistor M5 to the bit line BL. The actual value of the first additional voltage level VK may be preset.

The third voltage V3 may have a voltage level higher by the second additional voltage level VL than that of the second voltage V2. This allows the second current supply unit 220 controlled by the third voltage V3 to operate prior to the first current supply unit 200 controlled by the second voltage V2 when assuming that the sourcing node CSO and the sensing node SEN have the level of the power supply voltage VDD in a precharge state. In other words, as described above in the operations of the page buffer of a non-volatile memory device, when current starts to flows through the sourcing node CSO to the bit line BL and the voltage level of the sourcing node CSO falls, it is ensured that the second current supply unit 220 senses the voltage level of the sourcing node CSO prior to the first current supply unit 200 and allows current to flow through the sensing node SEN to the sourcing node CSO.

To generate the control signals with the characteristics described above, that is, the first voltage V1, the second voltage V2 and, the third voltage V3, an exemplary embodiment of a circuit is described below.

Figure 4:
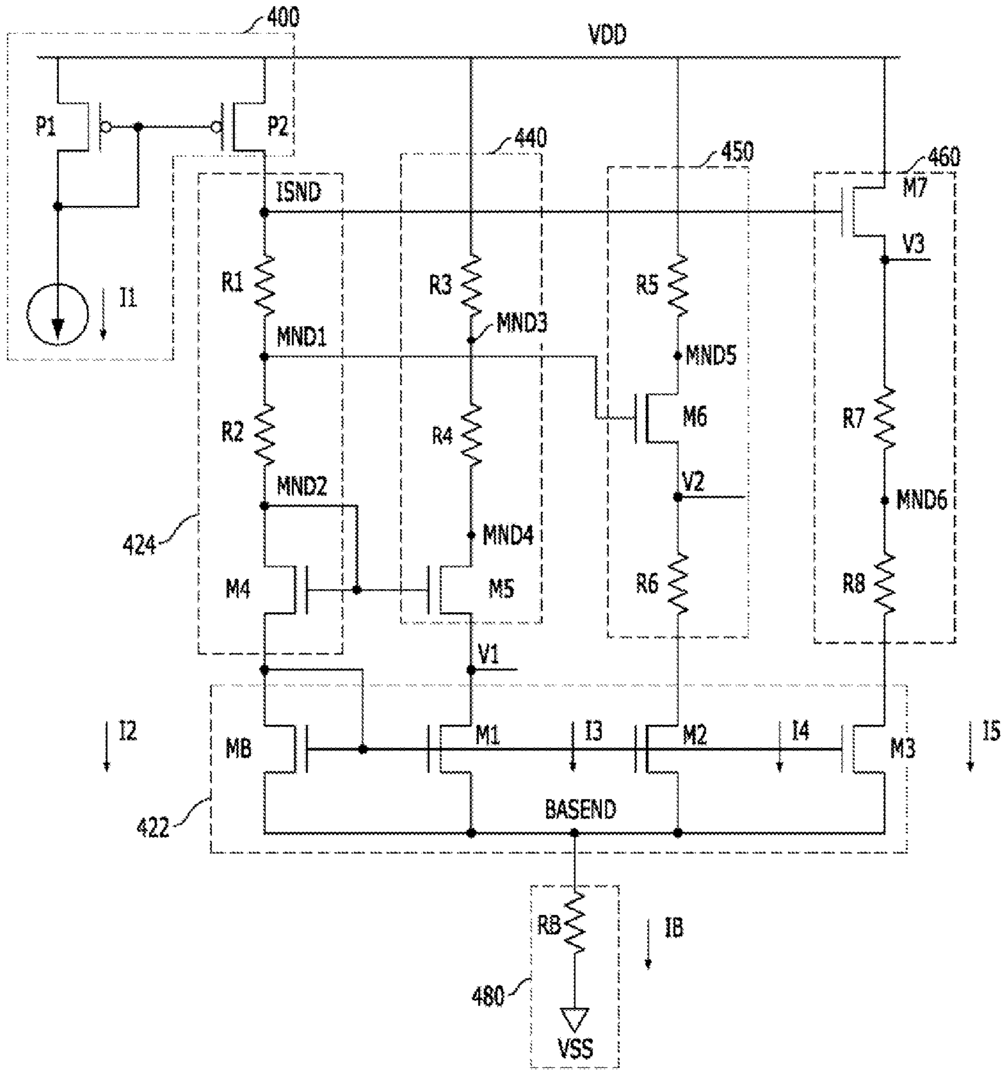
FIG. 4 is a circuit diagram illustrating a control voltage generation circuit ire accordance with an embodiment of the present invention.

FIG. 4 is a circuit diagram illustrating a control voltage generation circuit in accordance with an embodiment of the present invention.

Referring to FIG. 4, the control voltage generation circuit may include a current sourcing unit 400, a current mirror unit 422, a setting level dividing unit 424, a first voltage generation unit 440, a second voltage generation unit 450, a third voltage generation unit 460, and a reference level setting unit 480.

The current sourcing unit 400 may include a first PMOS transistor P1 and a second PMOS transistor P2.

One end of the first PMOS transistor P1 is connected to the power supply voltage VDD, and the other end and a gate of the first PMOS transistor P1 are commonly connected to a first current source I1. One end of the second PMOS transistor P2 is connected to the power supply voltage VDD, a gate of the second PMOS transistor P2 is connected to the first current source I1, and the other end of the second PMOS transistor P2 is connected to a current supply node ISND.

The current sourcing unit 400 allows the first current source I1 and the current supply node ISND to be connected in a current mirror type such that a second current I2 may flow through the current supply node ISND with the same magnitude as that of the first current source I1.

The current mirror unit 422 may include a current setting NMOS transistor MB and a first through third NMOS transistors M1 to M3.

Gates of the current setting NMOS transistor MB and the first through the third NMOS transistors M1 to M3 are commonly connected to a fourth NMOS transistor M4 of the setting level dividing unit 424. One end of the current setting NMOS transistor MB is connected to the fourth NMOS transistor M4 of the setting level dividing unit 424 and the other end of the current setting NMOS transistor MB is connected to a base node BASEND. One end of the first NMOS transistor M1 is connected in series to an output node of the first voltage V1, and the other end of the first NMOS transistor M1 is connected to the base node BASEND. One end of the second NMOS transistor M2 is connected in series to a sixth resistor R6 of the second voltage generation unit 450, and the other end of the second NMOS transistor M2 is connected to the base node BASEND. One end of the third NMOS transistor M3 is connected in series to an eighth resistor R8 of the third voltage generation unit 460 and the other end of the third NMOS transistor M3 is connected to the base node BASEND.

The current mirror unit 422 allows a third current I3, a fourth current I4, and a fifth current I5 to flow through the output node of the first voltage V1, the output node of the second voltage V2, and the output node of the third voltage V3 to the first through the third NMOS transistors M1 to M3 respectively with the same magnitude as the second current I2 flowing through the current supply node ISND from the current sourcing unit 400 due to a current mirroring phenomenon.

The setting level dividing unit 424 may include a first resistor R1, a second resistor R2, and the fourth NMOS transistor M4 that are connected in series. The first resistor R1 has one end connected to the current supply node ISND and the other end connected to a first intermediate node MND1. The second resistor R2 has one end connected to the first intermediate node MND1 and the other end connected to a second intermediate node MND2. The fourth NMOS transistor M4 has one end and a gate commonly connected to the second intermediate node MND2 and the other end connected to the one end of the current setting NMOS transistor MB.

The first voltage generation unit 440 may include a third resistor R3, a fourth resistor R4, and a fourth intermediate node MND4 that are connected in series. The third resistor R3 has one end connected to the power supply voltage VDD and the other end connected to a third intermediate node MND3. The fourth resistor R4 has one end connected to the third intermediate node MND3 and the other end connected to a fourth intermediate node MND4. The fifth NMOS transistor M5 has one end connected to the fourth intermediate node MND4, a gate connected to the second intermediate node MND2 and the other end connected to the output node of the first voltage V1.

The second voltage generation unit 450 may include a fifth resistor R5, a sixth NMOS transistor M6, and the sixth resistor R6 that are connected in series. The fifth resistor R5 has one end connected to the power supply voltage VDD and the other end connected to a fifth intermediate node MND5. The sixth NMOS transistor M6 has one end connected to the fifth intermediate node MND5, a gate connected to the first intermediate node MND1, and the other end connected to the output node of the second voltage V2. The sixth resistor R6 has one end connected to the output node of the second voltage V2, and the other end connected to the one end of the second NMOS transistor M2.

The third voltage generation unit 460 may include a seventh NMOS transistor M7, a seventh resistor R7, and the eighth resistor R8 that are connected in series. The seventh NMOS transistor M7 has one end connected to the power supply voltage VDD, a gate connected to the current supply node ISND and the other end connected to the output node of the third voltage V3. The seventh resistor R7 has one end connected to the output node of the third voltage V3 and the other end connected to a sixth intermediate node MND6. The eighth resistor R8 has one end connected to the sixth intermediate node MND6 and the other end connected to the one end of the third NMOS transistor M3.

The reference level setting unit 480 may include a base resistor RB having one end connected to the base node BASEND and the other end connected to the terminal of the ground voltage VSS. The one end of the base resistor RB is connected commonly to the other ends of the current setting NMOS transistor MB and the first through the third NMOS transistors M1, M2, and M3 of the current mirror unit 422.

The magnitude of base current IB, which flows through the base node BASEND to the ground voltage VSS, is equal to the total sum of the magnitudes of the second through the fifth current I2, I3, I4, and I5 that flow through the setting level dividing unit 424, the first voltage generation unit 440, the second voltage generation unit 450, and the third voltage generation unit 460 from the current sourcing unit 400 to the current mirror unit 422. When assuming that the second through fifth current I2, I3, I4, and I5 have the same magnitude (I1=I2=I3=I4=I5), the magnitude of the base current IB is 4 times larger than that of the second current I2.

When the voltage level of the base node BASEND is set to the reference voltage level VBL, the voltage level of the first voltage V1 becomes the voltage level of VBL+VTH or a sum of the threshold voltage level VTH of the first NMOS transistor M1 and the reference voltage level VBL; the voltage level of the second voltage V2 becomes the voltage level VBL+VTH+VK or a sum of the threshold voltage level VTH of the second NMOS transistor M2; the first additional voltage level VK set by the sixth resistor R6 and the reference voltage level VBL; and the voltage level of the third voltage V3 becomes the voltage level VBL+VTH+VK+VL or a sum of the threshold voltage level VTH of the third NMOS transistor M3, the reference voltage level VBL, the first additional voltage level VK, and the second additional voltage level VL set by the seventh resistor R7 and the eighth resistor R8.

For example, when the reference voltage level VBL of 0.5V is applied to the base node BASEND, because the magnitude of the base current IB is equal to the total sum of the second through fifth current I2, I3, I4, and I5, the magnitude of the first resistor R1 is expressed in Equation 1 for the voltage applied to the first resistor R1 to be 0.2V, $$R1=0.2/I2=0.2/IB*4=0.2/0.5*4*RB \quad \text{[Equation 1]}$$

Equation 1 may also be applied to the second through eighth resistors R2 to R8 for the voltages applied to the second through eighth resistors R2 to R8 to be 0.2V.

Because the voltage level of the base node BASEND is the reference voltage level VBL of 0.5V, the voltage level of the second intermediate node MND2 becomes the voltage level 0.5V+2*VTH that is a sum of the threshold voltage level VTH of the fourth NMOS transistor M4, the threshold voltage level VTH of the NMOS transistor MB, and the reference voltage level VBL. Likewise the voltage level of the first intermediate node MND1 becomes the voltage level 0.7V+2*VTH that is a sum of 0.2V of the second resistor R2, the voltage level 0.5V+2*VTH of the second intermediate node MND2, and the voltage level of the current supply node ISN, which becomes the voltage level 0.9V+2*VTH.

Similarly, the voltage level of the output node of the first voltage V1 becomes the voltage level 0.5V+VTH. Because the voltage level 0.5V+2*VTH of the second intermediate node MND2 is applied to the gate of the fifth NMOS transistor M5, which performs an operation of flowing current from the power supply voltage VDD to the output node of the first voltage V1 the output node of the first voltage V1 may stably retain the target voltage level of 0.5V+VTH. Because the voltage level 0.5V+2*VTH of the second intermediate node MND2 is higher than the target voltage level 0.5V+VTH of the output node of the first voltage V1 by the threshold voltage level VTH of the fifth NMOS transistor M5, the output node of the first voltage V1 stably retains the target voltage level of 0.5V+VTH.

Because the third and fourth resistors R3 and R4 are connected in series between the fifth NMOS transistor M5 and the power supply voltage VDD, an operation for retaining the voltage level of the first voltage V1 may be stabilized.

In a similar way, the voltage level of the output node of the second voltage V2 becomes 0.7V+VTH. Because the voltage level of 0.7V+2*VTH of the first intermediate node MND1 is applied to the gate of the sixth NMOS transistor M6, which performs an operation of flowing current from the power supply voltage VDD to the output node of the second voltage V2, the output node of the second voltage V2 may stably retain the target voltage level of 0.7V+VTH. Because the voltage level of 0.7V+2*VTH of the first intermediate node MND1 is higher than the target voltage level of 0.7V+VTH of the output node of the second voltage V2 by the threshold voltage level VTH of the sixth NMOS transistor M6, the output node of the second voltage V2 stably retains the target voltage level of 0.7V+VTH.

Because the fifth resistor R5 is connected in series between the sixth NMOS transistor M6 and the power supply voltage VDD, an operation for retaining the voltage level of the second voltage V2 may be stabilized.

The voltage level of the output node of the third voltage V3 becomes 0.9V+VTH. Because the voltage level of 0.9V+2*VTH of the current supply node ISND is applied to the gate of the seventh NMOS transistor M7, which performs an operation of flowing current from the terminal of the power supply voltage VDD to the output node of the third voltage V3, the output node of the third voltage V3 may stably retain the target voltage level of 0.9V+VTH. Because the voltage level of 0.9V+2*VTH of the current supply node ISND is higher than the target voltage level 0.9V+VTH of the output node of the third voltage V3 by the threshold voltage level VTH of the seventh NMOS transistor M7, the output node of the third voltage V3 stably retains the target voltage level of 0.9V+VTH.

One NMOS transistor M7 and two resistors R7 and R8 may keep an operation for retaining the voltage level of the third voltage V3 stabilized.

Referring to FIGS. 2 and 4, the level of the first voltage V1 should retain the voltage level VBL+VTH higher than the threshold voltage level VTH of the level fixing transistor for the level fixing transistor M5 to perform the operation of fixing the voltage level of the bit line BL to the reference voltage level VBL when the voltage level of the sourcing node CSO is higher than the reference voltage level VBL. To generate the same threshold voltage level VTH of each of the transistors, the sizes of transistors should be the same. The respective sizes of the transistors MB, M1, M2, M3, M4, M5, M6, and M7, which are shown in FIG. 4 and are used to set the levels of the first to third voltages V1, V2 and V3, should be the same as the size of the level fixing transistor M5 shown in FIG. 2.

While it was described in the embodiment as an example that the first additional voltage level VK is 0.2V and the second additional voltage level VL is 0.2V so that the first and second additional voltage levels VK and VL have the same voltage level, it is to be noted that that setting may actually be different levels. For operational flexibility, the size of the sixth resistor R6 for setting the first additional voltage level VK and the sizes of the seventh R7 or eighth resistor R8 for setting the second additional voltage level VL may be changed with independent manner. Each of the sixth resistor R6, the seventh R7, and eighth resistors R8 may be variable resistors, which leads to independent setting of the magnitude of the first additional voltage level VK and the magnitude of the second additional voltage level VL. When the sixth resistor R6, the seventh R7, and eighth resistors R8 are set to be variable resistors, the base resistor RB and the first through the fifth resistors R1, R2, R3, R4, and R5 may be correspondingly set to variable resistors for operational flexibility.

Figure 5:
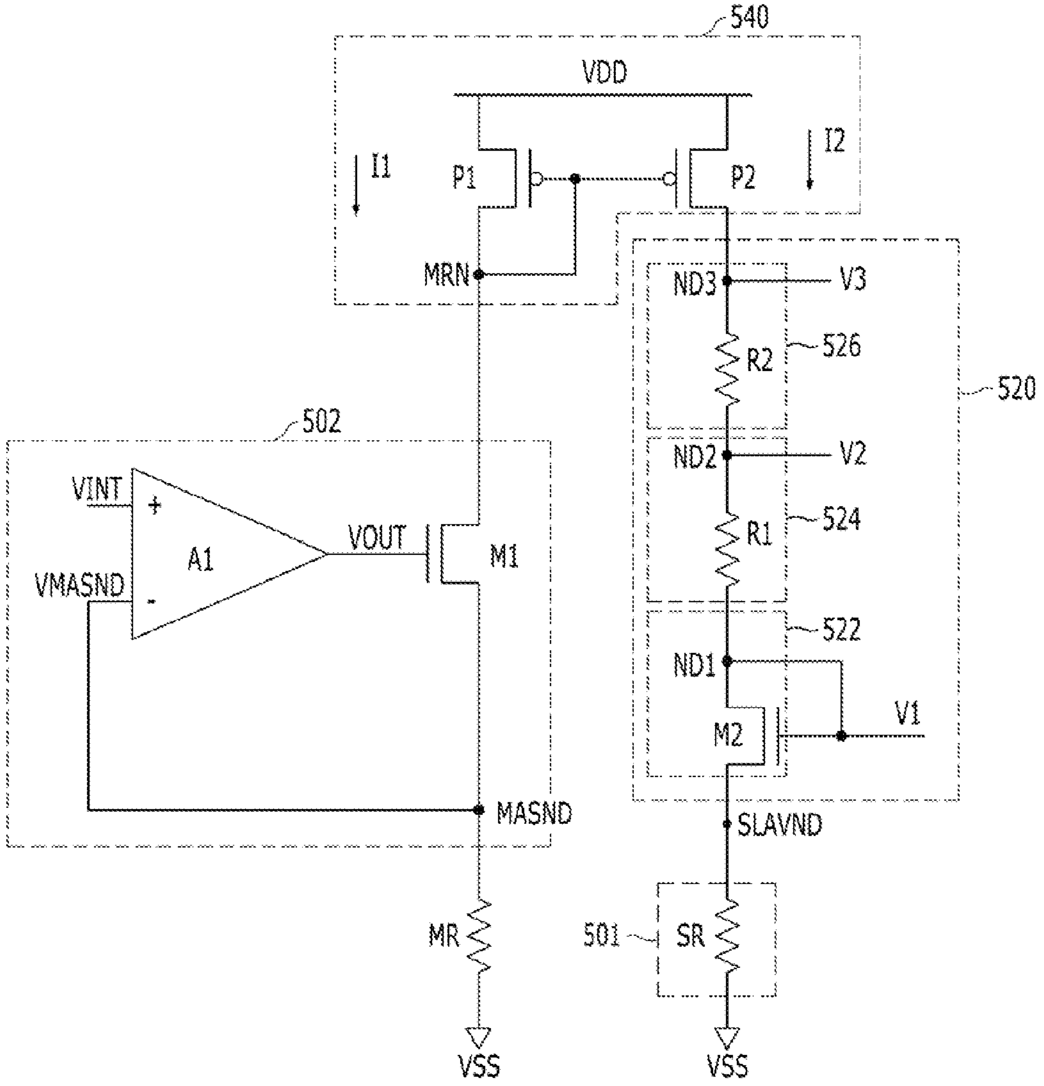
FIG. 5 is a circuit diagram illustrating a control voltage generation circuit in accordance with an embodiment of the present invention.

FIG. 5 is a circuit diagram illustrating a control voltage generation circuit in accordance with an embodiment of the present invention.

Referring to FIG. 5, the control voltage generation circuit may include a current mirror 540, a node setting block 502, a master resistor MR, a reference level setting unit 510, and a control voltage generation block 520. The control voltage generation block 520 may include a first voltage generation unit 522, a second voltage generation unit 524, and a third voltage generation unit 526.

The current mirror 540 may include a first PMOS transistor P1 having one end and a gate commonly connected with the node setting block 502 in series to a master node MASND with the other end connected to the power supply voltage VDD, a second PMOS transistor P2 having one end connected with the control voltage generation block 520 in series to a slave node SLAVND, and a gate connected to the node setting block 502 with the other end connected to the power supply voltage VDD. The current mirror 540 may control a first current I1 and a second current I2 to flow to the master node MASND and may also control the slave node SLAVND with the same magnitude through a current mirroring phenomenon.

The first current I1 flows through the first PMOS transistor P1 and the node setting block 502 to the master node MASND. The second current I2 flows through the second PMOS transistor P2 and the control voltage generation block 520 to the slave node SLAVND.

The node setting block 502 may set each voltage level of the master node MASND and the slave node SLAVND to the reference voltage level VBL when the first and second currents I1 and I2 flow to the master node MASND and the slave node SLAVND, respectively.

The master resistor MR is connected between the master node MASND and the ground voltage VSS. The master resistor MR sets the master node MASND to the reference voltage level VBL in correspondence to the first current I1.

The reference level setting unit 510 is connected between the slave node SLAVND and the ground voltage VSS and has the same resistance as the master resistor MR. The slave resistor SR sets the slave node SLAVND to the reference voltage level VBL in correspondence to the second current I2. The reference level setting unit may include the slave resistor SR The node setting unit 502 is connected between the current mirror 540 and the master node MASND. The node setting unit 502 may compare the reference voltage level VBL and the voltage level of the master node MASND, may control the magnitude of the first current I1 flowing from the current mirror 540 to the master node MASND, and may set the voltage level of the master node MASND to the reference voltage level VBL.

The node setting unit 502 may include a voltage level comparator A1 for comparing reference voltage level VBL and the voltage level of the master node MASND and an NMOS transistor M1 for controlling the amount of the first current I1 in response to an output signal C1 of the voltage level comparator A1 connected to a gate thereof. In the case where the voltage level of the master node MASND is higher than reference voltage level VBL, the first current I1 does not flow thereby lowering the voltage level of the master node MASND. In the case where the voltage level of the master node MASND is lower than reference voltage level VBL and the difference is relatively small, the magnitude of the first current source I1 is relatively small, thereby slightly raising the voltage level of the master node MASND. In the case where the voltage level of the master node MASND is lower than reference voltage level VBL and the difference is relatively large, the magnitude of the first current source I1 is relatively large, thereby substantially raising the voltage level of the master node MASND. As a consequence of these operations, the voltage level of the master node MASND conforms to the reference voltage level VBL. Accordingly, the magnitude of the first current source I1, is correspondingly controlled, and the master node MASND has the reference voltage level VBL.

When the master node MASND has the reference voltage level VBL, the slave node SLAVND also has the reference voltage level VBL because of the same resistances of the master resistor MR and the slave resistor SR and the same magnitude of the first and second currents I1 and I2 as described above.

The master resistor MR and the slave resistor SR may be variable resistors for operational flexibility.

The first through the third voltage generation units 522, 524, and 526 of the control voltage generation block 520 are connected in series between the current mirror 540 and the slave node SLAVND and generate the first through the third voltages V1, V2 and V3.

As disclosed above, the first voltage V1 has the voltage level of VBL+VTH, the second voltage V2 has the voltage level of VBL+VK+VTH, and the third voltage V3 has the voltage level of VBL+VK+VL+VTH.

The first voltage generation unit 522 may include a diode type NMOS transistor M2, which is connected between the slave node SLAVND and a first node ND1, and generates the first voltage V1 with the voltage level higher than the reference voltage level VBL. The NMOS transistor M2 has one end and a gate connected to the first node ND1 which is an output terminal of the first voltage V1, and the other end, which is connected to the slave node SLAVND and operates such that the voltage level of the first voltage V1 becomes the voltage level of VBL+VTH that is a sum of the threshold voltage level VTH of the NMOS transistor M2 and the reference voltage level VBL.

The second voltage generation unit 524 may include a first resistor R1, which is connected between the first node ND1 and a second node ND2, and generates the second voltage V2 with a voltage level higher than that of the first voltage V1. The first resistor R1 of the second voltage generation unit 524 has one end connected to the output terminal of the first voltage V1, and the other end connected to the second node ND2, which is an output terminal of the second voltage V2, and operates such that the voltage level of the second voltage V2 becomes the voltage level of VBL+VTH+VK that is a sum of the threshold voltage level VTH, the first additional voltage level VK set by the first resistor R1 and the reference voltage level VBL.

The third voltage generation unit 526 may include a second resistor R2 connected between a third node ND3 of the current mirror 540 and the second node ND2 and generates the third voltage V3 with a voltage level higher than that of the second voltage V2. The second resistor R2 of the third voltage generation unit 525 has one end connected to the second node ND2, which is the output terminal of the second voltage V2, and the other end connected to the third node ND3, which is the output terminal of the third voltage V3, and operates such that the voltage level of the third voltage V3 becomes the voltage level of VBL+VTH+VK+VL that is a sum of the threshold voltage level VTH, the first additional voltage level VK, the second additional voltage level VL set by the second resistor R2 and the reference voltage level VBL.

For example, when the reference voltage level VBL of 0.5V is applied to the master node MASND and the slave node SLAVND, the magnitudes of the master resistor MR, the slave resistor SR, the first resistor R1, and the second resistor R2 are as expressed in Equation 2 for the first additional voltage level VK and the second additional voltage level VL to be 0.2V.

$$MR=SR=0.5/I2=0.5/0.2*R1=0.5/0.2*R2 \quad \text{[Equation 2]}$$

Because the voltage level of the slave node SLAVND is the reference voltage level VBL of 0.5V, the voltage level of the one end of the NMOS transistor M1 becomes the voltage level 0.5V+VTH that is a sum of the threshold voltage level VTH of the NMOS transistor M1 and the reference voltage level VBL. Likewise, the level of the first voltage V1 becomes the voltage level of 0.5V+VTH that is a sum of the threshold voltage level VTH of the NMOS transistor M1 and the reference voltage level VBL.

The level of the second voltage V2 becomes the voltage level of 0.7V+VTH that is a sum of the first additional voltage level VK of 0.2V set by the first resistor R1 and the level of the first voltage V1.

The level of the third voltage V3 becomes the voltage level 0.9V+VTH that is a sum of the second additional voltage level VL of 0.2V set by the second resistor R2 and the level of the second voltage V2.

Referring to FIGS. 2 and 5, the level of the first voltage V1 should retain the voltage level VBL+VTH higher than the threshold voltage level VTH of the level fixing transistor M5 for the level fixing transistor M5 to perform the operation of fixing the voltage level of the bit line BL to the reference voltage level VBL when the voltage level of the sourcing node CSO is higher than the reference voltage level VBL. As disclosed above, the level fixing transistor M5 shown in FIG. 2 and the NMOS transistor M1 of the first voltage generation unit 522 shown in FIG. 5 should have the same size.

In order for operational flexibility, the first resistor R1 and the second resistor R2 may be variable resistors, leading to independent setting of the magnitude of the first additional voltage level VK and the magnitude of the second additional voltage level VL.

The node setting block 502 provides the reference current I2 with a preset magnitude to the control voltage generation block 520. Accordingly, the node setting block 502 and the current mirror 540 may be referred to as a current sourcing circuit. The slave resistor SR sets the voltage level of the slave node SLAVND to the reference voltage level VBL. Accordingly, the slave resistor SR may be referred to as a reference level setting circuit.

When comparing the embodiments shown in FIGS. 4 and 5, the number of transistors and resistors used therein is considerably decreased. That is to say, the embodiment shown in FIG. 5 minimizes the number of elements included in the circuits.

Because only one transistor M2 is used in the control voltage generation circuit shown in FIG. 5, when compared to eight transistors MB, M1, M2, M3, M4, M5, M6, and M7 used in the control voltage generation circuit shown in FIG. 4, an area to be occupied may be significantly reduced.

Because only two resistors R1 and R2 are used in the control voltage generation circuit shown in FIG. 5, when compared to eight resistors R1, R2, R3, R4, R5, R6, R7, and R8 used in the control voltage generation circuit shown in FIG. 4, an area to be occupied may be further significantly reduced.

Moreover, power consumption may be remarkably reduced. For example, assuming that the threshold voltage level VTH of the transistor is 0.9V, the control voltage generation circuit may operate with the power supply voltage VDD of 2.3V.

Although the disclosure illustrates the page buffer and the control voltage generation circuits used in a nonvolatile memory device as an embodiment, the present invention may be applied to various integrated circuits.

For example, the operation of sensing a state of cell data using the current sensing scheme in the nonvolatile memory device as described above may correspond to an operation of sensing an operation state of an internal circuit 300 by sensing a variation in current with a fixed voltage level of a signal transmission line connected to the internal circuit 300. That is to say, the scope of the present invention may cover an integrated circuit that performs the operation of sensing the operation state of the internal circuit 300 by sensing the variation in current with the fixed voltage level of the signal transmission line connected to the internal circuit 300. In particular, the scope of the present invention may cover a circuit that generates a plurality of control voltages with an appropriate level difference and adopts the current sensing scheme.

As is apparent from the above descriptions, the embodiments of the present invention advantageously uses a smaller number of transistor elements and resistor elements, each occupying a relatively large area and consuming a large power, and thus simplifies the control voltage generation circuit for controlling an operation of a circuit that senses a variation in current amount of a signal transmission line connected to an internal circuit and detects an operation state of the internal circuit.

Although various embodiments have been described for illustrative purposes, it will be apparent to those skilled in the art that various changes and modifications may be made without departing from the spirit and scope of the invention as defined in the following claims.

For instance, positions and kinds of the logic gates and transistors exemplified in the above-described embodiments should be differently realized according to the polarities of the signals inputted thereto.

What is claimed:

1. An integrated circuit comprising:

a node setting block connected to a first reference node and suitable for setting a voltage level of the first reference node to a reference voltage level;

a plurality of control voltage generation units connected in series to a second reference node and suitable for generating a plurality of control voltages of which voltage levels are variable; and a current sensing circuit suitable for sensing a variation of a current flowing through a signal transmission line by using the plurality of control voltages, the signal transmission line being connected to an internal circuit and a voltage level of the signal transmission line being fixed.

2. The integrated circuit according to claim 1, wherein the node setting block compares the reference voltage level with the voltage level of the first reference node and controls a magnitude of current flowing through the node setting block to the first reference node according to a comparison result so that the voltage level of the first reference node is set to the reference voltage level.

3. The integrated circuit according to claim 2, further comprising a current mirror suitable for providing a first current to the node setting block and a second current to the control voltage generation units, wherein the node setting block controls each magnitude of the first current and the second current, both flowing to the first and second reference nodes, so that the magnitudes of the first current and the second current are the same.

4. The integrated circuit according to claim wherein the plurality of control voltage generation units comprise:

a first voltage generation unit including a first transistor of a diode type, connected to the second reference node and suitable for generating a first voltage with a voltage level higher than the a voltage level of the second reference node;

a second voltage generation unit including a first resistor, connected in series to the first voltage generation unit in series and suitable for generating a second voltage with a voltage level higher than the first voltage; and a third voltage generation unit including a second resistor, connected in series between the second voltage generation unit and the current mirror and suitable for generating a third voltage with a voltage level higher than the second voltage.

5. The integrated circuit according to claim 4, wherein the current sensing circuit fixes the voltage level of the signal transmission line to the reference voltage level and senses the variation of the current flowing through the signal transmission line by sensing a variation of a voltage level of a sensing node that varies according to fixing of the voltage level of the signal transmission line.

6. The integrated circuit according to claim 5, wherein the current sensing circuit comprises:

a second transistor connected between the signal transmission line and a sourcing node and suitable for fixing the signal transmission line to the reference voltage level through a voltage level of the sourcing node in response to the first voltage;

a first current supply unit suitable for providing a current flowing through the sourcing node to the signal transmission line in response to the second voltage to retain the voltage level of the sourcing node higher than the reference voltage level; and a second current supply unit suitable for providing current flowing through the sensing node and the sourcing node to the signal transmission line in response to the third voltage.

7. The integrated circuit according to claim 6, wherein the first transistor and the second transistor have the same size.

8. The integrated circuit according to claim 6, wherein the voltage level of the second reference node, the voltage level of the first reference node and the reference voltage level have the same voltage level.

9. An integrated circuit comprising:

a reference level setting unit connected to a first reference node and suitable for setting a voltage level of the first reference node to a reference voltage level;

a first level setting unit including a first transistor of a diode type, connected to the first reference node and suitable for generating a first voltage with a voltage level higher than the reference voltage level;

a second level setting unit including a first resistor connected in series to the first level setting unit in series and suitable for generating a second voltage with a voltage level higher than that of the first voltage;

a third level setting unit including a second resistor connected in series to the second level setting unit and suitable for generating a third voltage with a voltage level higher than that of the second voltage;

a current sourcing unit connected in series to the third level setting unit and suitable for supplying a first reference current and with a predetermined magnitude to the first to the third level setting units and supplying a second reference current with the predetermined magnitude to a second reference node; and a current sensing circuit suitable for sensing a variation of a current flowing through a signal transmission line by using the first to the third voltages, the signal transmission line being connected to an internal circuit and a voltage level of the signal transmission line being fixed.

10. The integrated circuit according to claim 9, wherein the reference level setting unit comprises a third resistor between the first reference node and a ground voltage, and wherein the first reference current flows through the third resistor.

11. The integrated circuit according to claim 10, wherein the current sourcing unit comprises:

a fourth resistor connected between the ground voltage and the second reference node, and having the same size as the third resistor;

a level comparator suitable for comparing the reference voltage level with a voltage level of the second reference node and generating a control signal according to a comparison result;

a current control transistor connected to the second reference node and suitable for controlling an amount of current flowing through the fourth resistor in response to the control signal; and a current mirror suitable for providing the first reference current to the first to the third level setting units, and providing the second reference current to the fourth resistor.

12. The integrated circuit according to claim 11, wherein the first transistor has one end and a gate, both connected to the second level setting unit and the other end connected to the first reference node, and wherein a difference between a voltage level of the first voltage and a voltage level of the first reference node corresponds to a threshold voltage level of the first transistor.

13. The integrated circuit according to claim 12, wherein the first resistor and the second resistor are variable resistors.

14. The integrated circuit according to claim 13, wherein the current sensing circuit fixes the voltage level, of the signal transmission line to the reference voltage level and senses the variation of the current flowing through the signal transmission line by sensing a variation of a voltage level of a sensing node that varies according to fixing of the voltage level of the signal transmission line.

15. The integrated circuit according to claim 14, wherein the current sensing circuit comprises:

a level fixing transistor connected between the signal transmission line and a sourcing node and suitable for fixing the signal transmission line to the reference voltage level through a voltage level of the sourcing node in response to the first voltage;

a first current supply unit suitable for providing a current flowing through the sourcing node to the signal transmission line in response to the second voltage to retain the voltage level of the sourcing node higher than the reference voltage level; and a second current supply unit suitable for providing current flowing through the sensing node and the sourcing node to the signal transmission line in response to the third voltage.

16. The integrated circuit according to claim 15, wherein the first transistor and the level fixing transistor have the same size.

17. The integrated circuit according to claim 12, wherein the voltage level of the first reference node, a voltage level of the second reference node and the reference voltage level have the same voltage level.

* * * * *